United States Patent
Hwang et al.

(10) Patent No.: US 11,888,059 B2
(45) Date of Patent: Jan. 30, 2024

(54) FIELD EFFECT TRANSISTOR INCLUDING GRADUALLY VARYING COMPOSITION CHANNEL

(71) Applicant: Samsung Electronics Co., Ltd., Suwon-si (KR)

(72) Inventors: Injun Hwang, Yongin-si (KR); Jongseob Kim, Seoul (KR); Joonyong Kim, Seoul (KR); Younghwan Park, Suwon-si (KR); Junhyuk Park, Pohang-si (KR); Dongchul Shin, Suwon-si (KR); Jaejoon Oh, Seongnam-si (KR); Soogine Chong, Seoul (KR); Sunkyu Hwang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 212 days.

(21) Appl. No.: 17/349,327

(22) Filed: Jun. 16, 2021

(65) Prior Publication Data
US 2021/0313465 A1    Oct. 7, 2021

Related U.S. Application Data

(63) Continuation of application No. 16/703,128, filed on Dec. 4, 2019, now Pat. No. 11,069,802.

(30) Foreign Application Priority Data

Jun. 10, 2019  (KR) .................. 10-2019-0068262

(51) Int. Cl.
*H01L 29/10*    (2006.01)
*H01L 29/778*   (2006.01)
(Continued)

(52) U.S. Cl.
CPC ........ *H01L 29/7813* (2013.01); *H01L 29/086* (2013.01); *H01L 29/0869* (2013.01);
(Continued)

(58) Field of Classification Search
None
See application file for complete search history.

(56) References Cited

U.S. PATENT DOCUMENTS

| | | |
|---|---|---|
| 7,187,021 B2 | 3/2007 | Mitra et al. |
| 7,525,130 B2 | 4/2009 | Mishra et al. |

(Continued)

FOREIGN PATENT DOCUMENTS

| | | |
|---|---|---|
| JP | 2009188041 A | 8/2009 |
| KR | 101690442 B1 | 12/2016 |

OTHER PUBLICATIONS

Armstrong, A. "AlGaN polarization-doped field effect transistor with compositionally graded channel from Al0.6Ga0.4N to AlN" Appl. Phys. Lett. 114 May 2, 2019 pp. 052103-1 through 052103-4 (Year: 2019).*

(Continued)

*Primary Examiner* — Grant S Withers
(74) *Attorney, Agent, or Firm* — Harness, Dickey & Pierce, P.L.C.

(57) ABSTRACT

Provided is a field effect transistor (FET) including a gradually varying composition channel. The FET includes: a drain region; a drift region on the drain region; a channel region on the drift region; a source region on the channel region; a gate penetrating the channel region and the source region in a vertical direction; and a gate oxide surrounding the gate. The channel region has a gradually varying composition along the vertical direction such that an intensity of a polarization in the channel region gradually varies.

36 Claims, 16 Drawing Sheets

(51) Int. Cl.
*H01L 29/78* (2006.01)
*H01L 29/20* (2006.01)
*H01L 29/205* (2006.01)
*H01L 29/08* (2006.01)
*H01L 29/40* (2006.01)

(52) U.S. Cl.
CPC ...... *H01L 29/0878* (2013.01); *H01L 29/0886* (2013.01); *H01L 29/1033* (2013.01); *H01L 29/1037* (2013.01); *H01L 29/1054* (2013.01); *H01L 29/1095* (2013.01); *H01L 29/2003* (2013.01); *H01L 29/205* (2013.01); *H01L 29/402* (2013.01); *H01L 29/404* (2013.01); *H01L 29/407* (2013.01); *H01L 29/7803* (2013.01); *H01L 29/7831* (2013.01)

(56) References Cited

U.S. PATENT DOCUMENTS

| | | | |
|---|---|---|---|
| 8,835,998 | B2 | 9/2014 | Simon et al. |
| 9,362,389 | B2 | 6/2016 | Xing et al. |
| 9,806,203 | B2 | 10/2017 | Then et al. |
| 9,905,647 | B2 | 2/2018 | Fay et al. |
| 9,954,085 | B2 | 4/2018 | Fay et al. |
| 2008/0173956 | A1 | 7/2008 | Bhalla et al. |
| 2010/0327318 | A1 | 12/2010 | Okamoto et al. |
| 2012/0199889 | A1 | 8/2012 | Miyamoto et al. |
| 2013/0234156 | A1 | 9/2013 | Okada et al. |
| 2014/0167058 | A1 | 6/2014 | Laboutin et al. |
| 2016/0079410 | A1 | 3/2016 | Yasumoto et al. |
| 2016/0343801 | A1 | 11/2016 | Pilla et al. |
| 2018/0323298 | A1 | 11/2018 | Dasgupta et al. |
| 2023/0101293 | A1* | 3/2023 | Hiroki ................ H01L 29/2003 257/183 |

OTHER PUBLICATIONS

He, Y-H "Vertical polarization-induced doping InN/InGaN heterojunction tunnel FET with hetero T-shaped gate" Chin. Phys. B vol. 30, No. 5, May 2021 pp. 058201-1 through 057501-7 (Year: 2021).*

Pil Sung Park et al., 'Electron gas dimensionality engineering in AlGaN/GaN high electron mobility transistors using polarization' *Applied Physics Letters*, vol. 100, 063507, 2012.

I. Ben-Yaacov et al., AiGaN/GaN current aperture vertical electron transistors with regrown channels *Journal of Applied Physics*, 95(4), Feb. 2004.

Notice of Allowance dated Mar. 19, 2021, issued in corresponding U.S. Appl. No. 16/703,128.

* cited by examiner

FIELD EFFECT TRANSISTOR INCLUDING GRADUALLY VARYING COMPOSITION CHANNEL

CROSS-REFERENCE TO RELATED APPLICATION

This application is a continuation of U.S. application Ser. No. 16/703,128, filed Dec. 4, 2019, which claims the benefit of Korean Patent Application No. 10-2019-0068262, filed on Jun. 10, 2019, in the Korean Intellectual Property Office, the disclosures of each of which are incorporated herein in their entirety by reference.

BACKGROUND

1. Field

The present disclosure relates to field effect transistors, and more particularly, to group III-V field effect transistors including a gradually varying composition channel.

2. Description of Related Art

In a power converting system for receiving main power to be converted into a voltage required for a plurality of devices or to be distributed, the function of a power switching device is important. For example, the power switching device may be realized by a transistor based on a semiconductor material such as silicon, GaN, or SiC, like a metal oxide semiconductor field effect transistor (MOSFET). The power switching device is required to have a high breakdown voltage. A large amount of research on the power switching device is being conducted in order to obtain characteristics of reduction in an on-resistance, high density integration, and rapid switching.

For example, a field effect transistor (FET) of a trench gate structure, in which a trench is vertically formed and a gate oxide layer and a gate are formed in the trench, is advantageous in terms of high current and high density integration. Research on improving mobility in a channel of the FET is being conducted.

SUMMARY

According to an aspect of an embodiment, a field effect transistor (FET) includes: a drain region; a drift region on the drain region; a channel region on the drift region; a source region on the channel region; a gate, and a gate oxide. The gate penetrates the channel region and the source region in a vertical direction. The gate oxide surrounds the gate. The channel region has a gradually varying composition along the vertical direction such that an intensity of a polarization in the channel region gradually varies.

In some embodiments, at least one of the drain region, the drift region, the channel region, and the source region may include a group III-V compound semiconductor as a semiconductor material, and the group III-V compound semiconductor may include a Group III element and a Group V element. The Group III element may include at least one element of boron (B), aluminum (Al), gallium (Ga), and indium (In). The Group V element may include nitrogen (N).

In some embodiments, the field effect transistor may be arranged in such a way that the Group V element is located on an upper side of the c-axis and the Group III element is located on the lower side of the c-axis, along the c-axis direction.

In one embodiment, the drain region and the drift region may each include GaN, the channel region may include $Al_xGa_{1-x}N$ ($0 \leq x \leq 1$) or $B_yAl_xIn_zGa_{1-x-y-z}N$ ($0 \leq x+y+z \leq 1$), and x or y may increase in the channel region in an upper direction of the vertical direction.

In some embodiments, the source region may include $Al_aGa_{1-a}N$ or $B_bAl_dIn_cGa_{1-a-b-c}N$ ($0 < a+b+c \leq 1$) and a may be equal to a maximum value of x in the channel region.

In some embodiments, the drain region and the source region may each be doped at a first concentration and the drift region may be doped at a second concentration that is less than the first concentration, and the channel region is undoped.

In some embodiments, the field effect transistor may further include an interface region between the channel region and the source region, wherein the interface region may include $Al_xGa_{1-x}N$ ($0 \leq x \leq 1$) or $B_yAl_xIn_zGa_{1-x-y-z}N$ ($0 \leq x+y+z \leq 1$) and x or y in the interface region may decrease in the upper direction.

In some embodiments, the source region may include $Al_aGa_{1-a}N$ or $B_bAl_dIn_cGa_{1-a-b-c}N$ ($0 \leq a+b+c < 1$), a may be greater than or equal to 0 and less than a maximum value of x in the channel region.

In some embodiments, the drain region and the source region each may be doped at a first concentration, the drift region may be doped at a second concentration that is less than the first concentration, the channel region may be undoped, and the interface region may be doped at a third concentration that is less than the first concentration and greater than the second concentration.

In other embodiments, the field effect transistor may be arranged in such a way that the Group III element may be located on the upper side and a Group V element may be located on the lower side, along the c-axis direction.

In some embodiments, the drain region and the drift region may each include GaN, the channel region may include $In_xGa_{1-x}N$ ($0 \leq x \leq 1$) or $B_yAl_zIn_xGa_{1-x-y-z}N$ ($0 \leq x+y+z \leq 1$), and x may increase in an upper direction of the vertical direction.

In some embodiments, the source region may include $In_aGa_{1-a}N$ or $B_bAl_cIn_aGa_{1-a-b-c}N$ ($0 < a+b+c \leq 1$), and a may be equal to a maximum value of x in the channel region.

In some embodiments, the drain region and the source region each may be doped at a first concentration and the drift region may be doped at a second concentration that is less than the first concentration, and the channel region may be undoped.

In some embodiments, the field effect transistor may further include an interface region between the channel region and the source region, wherein the interface region may include $In_xGa_{1-x}N$ ($0 \leq x \leq 1$) or $B_yAl_zIn_xGa_{1-x-y-z}N$ ($0 < x+y+z \leq 1$), and x may decrease in the upper direction in the interface region.

In some embodiments, the source region may include $In_aGa_{1-a}N$ or $B_bAl_cIn_aGa_{1-a-b-c}N$ ($0 < a+b+c < 1$) and a may be less than a maximum value of x in the channel region.

In some embodiments drain region and the source region may be doped at a first concentration, the drift region may be doped at a second concentration that is less than the first concentration, the channel region may be undoped, and the interface region may be doped at a third concentration that is less than the first concentration and greater than the second concentration.

In some embodiments, the drain region, the drift region, and the source region may include GaN, the channel region may include $Al_xGa_{1-x}N$ (0≤x≤1) or $B_yAl_xIn_zGa_{1-x-y-z}N$ (0≤x+y+z≤1), and x or y may decrease in the channel region in an upper direction.

In some embodiments, the drain region and the source region each may be doped at a first concentration and the drift region may be doped at a second concentration that is less than the first concentration, and the channel region may be undoped.

In some embodiments, the field effect transistor may further include an interface region between the drift region and the channel region, and the interface region may include $Al_xGa_{1-x}N$ (0≤x≤1) or $B_yAl_xIn_zGa_{1-x-y-z}N$ (0≤x+y+z≤1) and x or y in the interface region may increase in the upper direction.

In some embodiments, the drain region and the source region may be doped at a first concentration, the drift region may be doped at a second concentration that is less than the first concentration, and the channel region and the interface region may be undoped.

In some embodiments, the drain region and the drift region may include AlGaN, the channel region may include $Al_xGa_{1-x}N$ (0≤x≤1) or $B_yAl_xIn_zGa_{1-x-y-z}N$ (0≤x+y+z≤1), and x or y may decrease in the upper direction of the vertical direction.

In some embodiments, the source region may include GaN.

In some embodiments, the drain region and the source region each may be doped at a first concentration and the drift region may be doped at a second concentration that may be less than the first concentration, and the channel region may be undoped.

In some embodiments, the drain region, the drift region, and the source region each may be doped with a first conductive type. All or a part of the channel region in the vertical direction may be doped with a second conductive type that may be electrically opposite to the first conductive type, and a doping concentration of the channel region may be less than a doping concentration of the drain region.

In some embodiments, a doping concentration of the channel region may be $10^{19}/cm^3$ or lower.

In some embodiments, a lower portion of the gate may be on a first portion of the gate oxide, a second portion of the gate oxide may extend along a side surface of the gate, and a thickness of the first portion in the vertical direction may be greater than a width of the second portion in a horizontal direction.

In some embodiments, the FET may further include a metal plate, an insulating layer, and a second gate. The gate may be a first gate. The first gate and the second gate may be adjacent to each other. The metal plate may penetrate the channel region and the source region in the vertical direction, and the insulating layer may surround the metal plate.

In some embodiments, the FET may further include a doping region. The drain region, the drift region, and the source region each may be doped with a first conductive type. The doping region may contact a lower surface of the gate oxide and the doping region may be doped with a second conductive type that may be electrically opposite to the first conductive type.

In some embodiments, the FET may further include a well region and a second gate. The gate may be a first gate. The drain region, the drift region, and the source region may be doped with a first conductive type. The first gate and the second gate may be adjacent to each other. The well region may be between the first gate and the second gate. The well region may penetrate the channel region and the source region in the vertical direction. The well region may be doped with a second conductive type that may be electrically opposite to the first conductive type.

In some embodiments, the FET may further include a PN junction extending in the vertical direction in a lower portion of the well region.

In some embodiments, the gate may be a first gate and the FET may further include a second gate. The first gate and the second gate may be adjacent to each other, and a width of the source region between the first gate and the second gate may be about 500 nm or less.

In some embodiments, the drain region and the drift region each may be doped with a first conductive type, and the source region may include an undoped first group III-V compound semiconductor layer and an undoped second group III-V compound semiconductor layer on the undoped first group III-V compound semiconductor layer. The undoped first group III-V compound semiconductor layer and the undoped second group III-V compound semiconductor layer have different compositions from each other.

In some embodiments, a first portion of the gate oxide may extend between the gate and the drift region.

In some embodiments, a second portion of the gate oxide may extend between the gate and the source region.

In some embodiments, the first portion of the gate oxide and the second portion of the gate oxide may cross each other.

In some embodiments, the channel region may include a group III-V compound semiconductor as a semiconductor material and the group III-V compound semiconductor may include a group III element and a group V element. The group III element may include gallium (Ga) and at least one of boron (B), aluminum (Al), or indium (In). The group V element may include nitrogen (N). A concentration of the at least one of boron (B), aluminum (Al), or indium (In) may vary gradually in the vertical direction in the channel region.

In some embodiments, the drain region and the drift region may include GaN.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
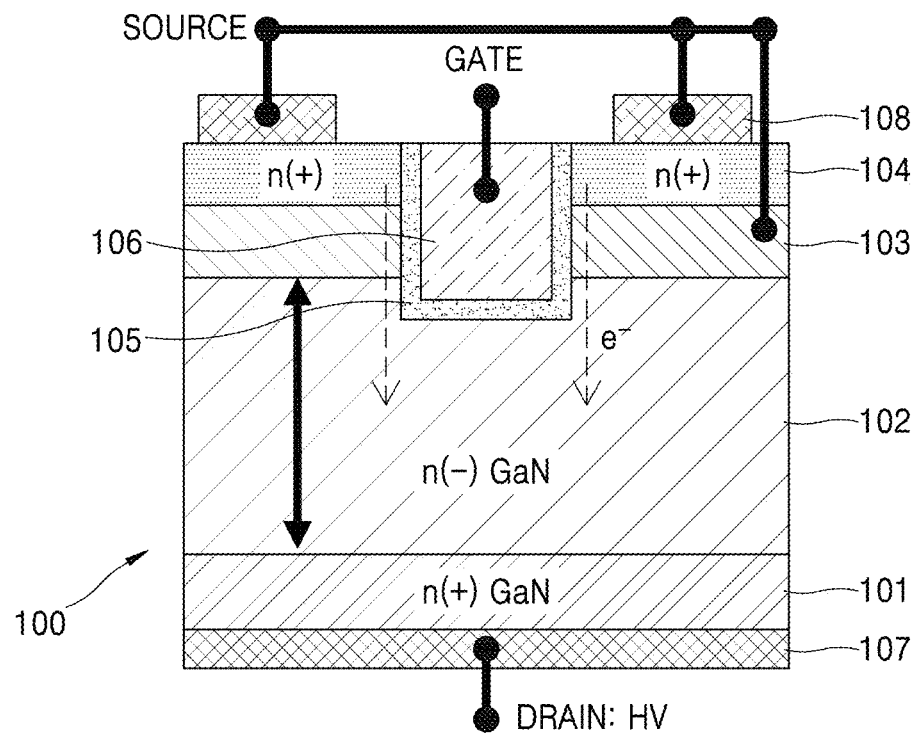
FIG. 1 is a cross-sectional view schematically illustrating a structure of a field effect transistor (FET) according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a field effect transistor including a gradually varying composition channel will be described in detail with reference to the accompanying drawings. In the drawings, the same reference numerals represent the same element and the sizes of elements are exaggerated for clarity and for the sake of convenience. Embodiments described hereinafter are only exemplary and various changes may be made therein. In the following, what is described as "upper" or "on" may include not only those in contact with and directly above, below, left, and right but also those in non-contact with and directly above, below, left, and right. The expression of singularity in the present specification includes the expression of plurality unless clearly specified otherwise in context. Also, terms such as "comprise" and/or "comprising" may be construed to denote a constituent element, but may not be construed to exclude the existence of or a possibility of addition of another constituent element.

FIG. 1 is a cross-sectional view schematically illustrating a structure of a field effect transistor (FET) 100 according to an embodiment. In particular, the FET 100 shown in FIG. 1 is a FET including a group III-V compound semiconductor as a semiconductor material. Referring to FIG. 1, the FET 100 according to an embodiment may include a drain region 101, a drift region 102 disposed on the drain region 101, a channel region 103 disposed on the drift region 102, a source region 104 disposed on the channel region 103, a gate 106 disposed to penetrate the channel region 103 and the source region 104 in a vertical direction, and a gate oxide 105 surrounding the gate 106. Depending on the context, the term "region" in the present application may also be referred to as a layer (e.g., drain layer 101, drift layer 102, channel layer 103, source layer 104, interface layer 109 in FIG. 9, etc.).

The FET 100 may further include a drain electrode 107 disposed on a lower surface of the drain region 101 and a source electrode 108 disposed on the source region 104. In FIG. 1, the gate oxide 105 surrounds only a lower surface and side surfaces of the gate 106, an upper surface of the gate 106 is exposed to the outside, and a plurality of source electrodes 108 are respectively disposed on the source regions 104 corresponding thereto but the present disclosure is not necessarily limited thereto. The gate oxide 105 may be formed to further cover the upper surface of the gate 106. In this case, one source electrode 108 may be arranged to cover both the plurality of source regions 104 and the gate oxide 105.

The gate 106, the drain electrode 107, and the source electrode 108 may be formed of a conductive material. For example, materials of the gate 106, the drain electrode 107, and the source electrode 108 may include a metal, an alloy, a conductive metal oxide, or a conductive metal nitride. The gate 106 may be formed by vertically penetrating the source region 104 and the channel region 103 through etching to form a trench such that a part of the drift region 102 is exposed to the outside, forming the gate oxide 105 in a bottom surface and an inner wall of the trench, and then filling the conductive material in the trench. Thus, both sides of the gate 106 may be disposed to face a side surface of the source region 104 and a side surface of the channel region 103. The lower surface of the gate oxide 105 may also contact the drift region 102 and a part of a side surface of the gate oxide 105 may also contact the drift region 102. The gate oxide 105 may include silicon nitride (SiN), silicon oxide ($SiO_2$), silicon oxynitride (SiON), aluminum nitride (AlN), aluminum oxide ($Al_2O_3$), aluminum oxynitride (AlON), tantalum oxide ($Ta_2O_5$), hafnium oxide ($HfO_2$) or other dielectric material having a high dielectric constant High-K.

The FET 100 according to the present embodiment may be a high power transistor which may be used as a power switching element, in particular, a high power metal oxide semiconductor field-effect transistor (MOSFET). The drift region 102 of a relatively great thickness may be disposed on the drain region 101 which also functions as a substrate, in order to have a withstand voltage characteristic capable of withstanding a high voltage. For example, the drift region 102 may have a greater thickness than the drain region 101, the channel region 103, and the source region 104.

The drain region 101, the drift region 102, and the source region 104 may be doped to have electrically the same polarity such that current may flow between the source region 104 and the drain region 101 when a voltage is applied to the gate 106. In particular, the drain region 101 and the source region 104 may be doped at a high concentration. For example, the drain region 101 and the source region 104 may be n+ doped. The drift region 102 may be doped at a concentration less than an n+ doping concentration to have a withstand voltage characteristic that may withstand a high voltage. For example, the drain region 101 and the source region 104 may be doped at a doping concentration of $10^{19}/cm^3$ or higher, and the drift region 102 may be doped at a doping concentration of $10^{17}/cm^3$ or lower.

The drain region 101, the drift region 102, the channel region 103, and the source region 104 may include III-V compound semiconductors. A Group III element includes at least one element of boron (B), aluminum (Al), gallium (Ga), and indium (In), and a Group V element includes nitrogen (N) element. For example, the drain region 101 may include n+ GaN or n+ AlGaN, the drift region 102 may include n− GaN or n− AlGaN, the channel region 103 may include AlGaN, BAlGaN, BAlInGaN, InGaN, or BInGaN, and the source region 104 may include n+ GaN, n+ AlGaN, n+ BAlGaN, n+ BAlInGaN, n+ InGaN, or n+ BInGaN. Here, as a dopant for doping the drain region 101, the drift region 102 and the source region 104, for example, silicon (Si) may be used.

Meanwhile, the channel region 103 may be doped at a polarity that is electrically opposite to the drain region 101, the drift region 102, and the source region 104, for example, p-type. However, when the doping concentration of the channel region 103 is high, the speed of charge carriers in the channel region 103 may be lowered, and thus the FET 100 may have a low mobility. According to the present embodiment, by using the inherent polarization property of the group III-V compound semiconductor without doping the channel region 103, it is possible to improve the speed of the charge carrier while having the same hole providing effect as that in which the channel region 103 is doped to the p-type at a high concentration.

Figure 2:
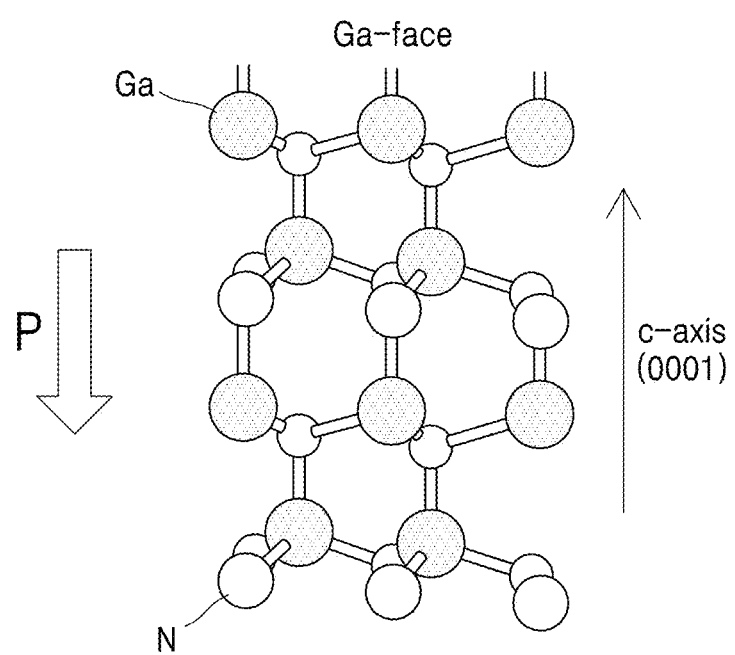
FIG. 2 shows an example of a lattice structure of a group III-V semiconductor for explaining a spontaneous polarization formed in a group III-V semiconductor.

FIG. 2 shows an example of a lattice structure of a group III-V semiconductor for explaining a spontaneous polarization formed in a group III-V semiconductor. In particular, FIG. 2 schematically illustrates the example of the lattice structure of the simplest GaN. Referring to FIG. 2, GaN and its alloy are most stable in the Wurtzite structure, and elements in the lattice rotate about 120° with respect to each other. In addition, a GaN lattice has two (or three) equivalent basal plane axes (an a-axis) that are all perpendicular to a c-axis. Elements of group III and group V occupy the c-planes alternately along the c-axis. For example, in the GaN lattice, Ga elements are arranged in one c-plane, N elements are arranged in another c-plane, and c-planes in which the Ga elements are arranged and c-planes in which the N elements are arranged are arranged alternately with each other.

Thus, the spontaneous polarization occurs in the lattice of the group III-V semiconductor because the Group III elements and the Group V elements are separately arranged in different planes along a vertical direction, that is, along a c-axis direction. For example, when the plane of the N elements is located at the lowermost portion and the plane of the Ga elements is located at the uppermost portion in the GaN lattice (e.g., Ga-face), as shown in FIG. 2, the spontaneous polarization occurs in the GaN lattice in a lower direction. Conversely, when the plane of the Ga elements is located at the lowermost portion and the plane of the N elements is located at the uppermost portion in the GaN lattice (e.g., N-face), the spontaneous polarization occurs in the GaN lattice in an upper direction.

Further, when different nitride semiconductors of different compositions (that is, different lattice constants) are bonded to each other, a piezoelectric polarization occurs due to stress caused by a difference in a lattice constant between the different nitride semiconductors. For example, a lattice constant of InGaN increases as In increases, and a lattice constant of AlGaN decreases as Al increases. Therefore, when InGaN is grown on a sufficiently thick GaN layer, InGaN is subjected to compressive strain. Meanwhile, when AlGaN is grown on the sufficiently thick GaN layer, AlGaN is subjected to tensile strain. As a result, the piezoelectric polarization in the InGaN grown on the GaN layer is directed in a direction opposite to the spontaneous polarization of GaN. Meanwhile, in the AlGaN grown on the GaN layer, the piezoelectric polarization is directed in the same direction as the spontaneous polarization of GaN. As a composition of In increases in InGaN or a composition of Al increases in AlGaN, an intensity of the piezoelectric polarization increases.

Figure 3:
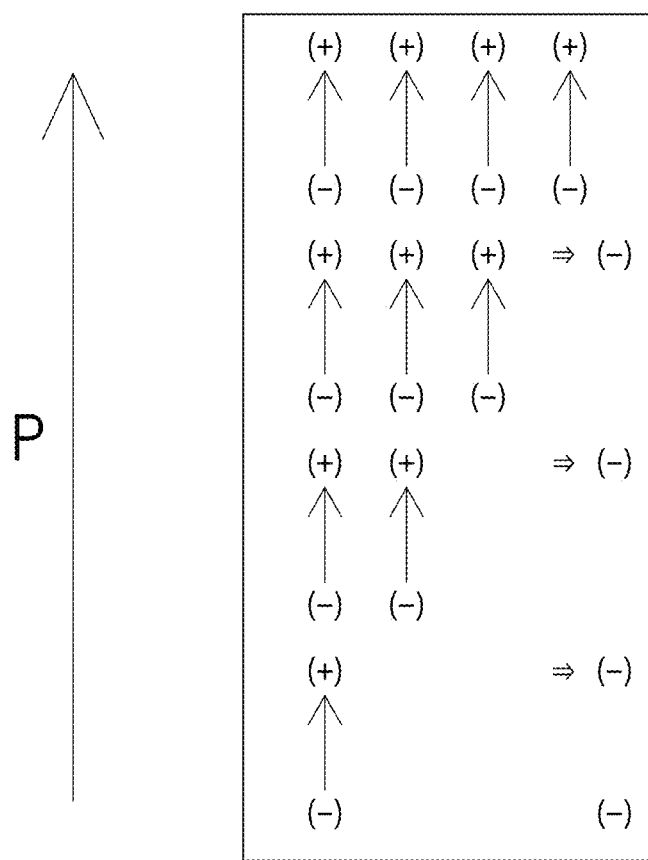
FIG. 3 illustrates an example of an effect of polarization having a gradually varying intensity at an N-face.

FIG. 3 illustrates an example of an effect of polarization having a gradually varying intensity at N-face. For example, FIG. 3 shows an overall polarization P (e.g., a piezoelectric polarization+a spontaneous polarization) in AlGaN when a composition of Al gradually increases along an upper direction in AlGaN on GaN that is c-axis oriented. Referring to FIG. 3, a direction of the overall polarization P in the AlGaN is an upper direction, and an intensity of the polarization P also increases upward. Then, negative (−) charges are mainly distributed on a lower surface and an inner portion of AlGaN, and positive (+) charges are mainly distributed on an upper surface of AlGaN. Also, in the inner portion of AlGaN, negative (−) fixed charges are distributed due to an intensity difference of the polarization P. In order to achieve a space charge neutrality, positive (+) free charges are generated in an inner space of AlGaN. Therefore, AlGaN having a gradually varying composition such that the intensity of the polarization increases P along the same direction as the direction of the polarization P may have the same effect as doped to the p-type. Meanwhile, AlGaN having a gradually varying composition such that the intensity of the polarization P decreases along the same direction as the direction of the polarization P, e.g., in order to increase the intensity of the polarization P along a direction opposite to the direction of the polarization P, may have the same effect as doped to the n-type.

Figure 4:
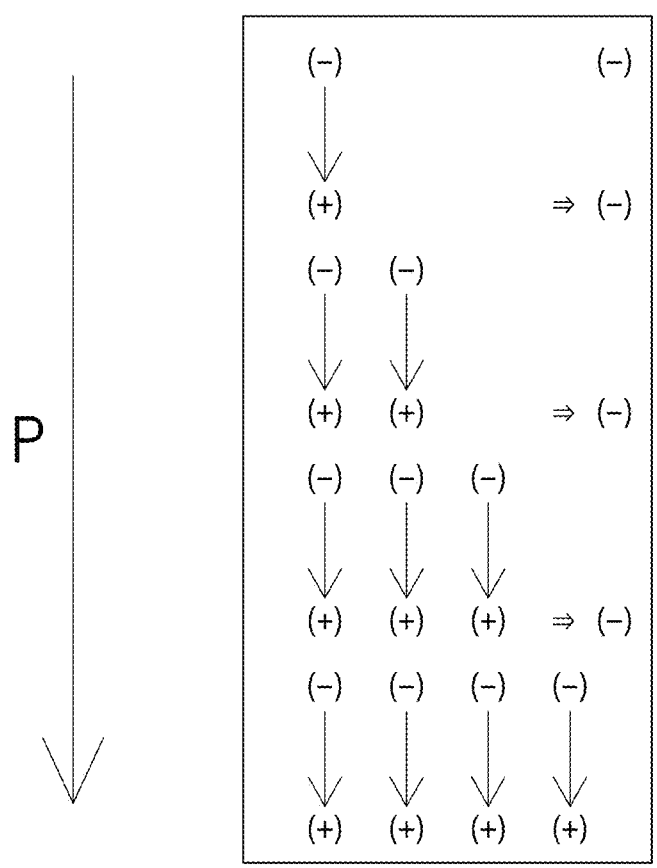
FIG. 4 illustrates an example of an effect of polarization having a gradually varying intensity at a Group III-face.

Also, FIG. 4 illustrates an example of an effect of polarization having a gradually varying intensity at Group III-face. For example, FIG. 4 shows the overall polarization P in InGaN when a composition of In gradually increases along an upper direction in InGaN on GaN that is c-axis oriented to Ga-face. Referring to FIG. 4, a direction of the overall polarization P in Ga-face is a lower direction. Meanwhile, a direction of a piezoelectric polarization in InGaN is an upper direction, and an intensity of the piezoelectric polarization increases upward. Accordingly, the direction of the overall polarization P is the lower direction, and the intensity of the polarization P increase downward. Then, negative (−) charges are mainly distributed on an upper surface and an inner portion of InGaN, and positive (+) charges are mainly distributed on a lower surface of InGaN. In addition, because negative (−) fixed charges are mainly distributed in the inner portion of InGaN, positive (+) free charges are induced and thus space charges are neutralized. Therefore, InGaN having a gradually varying composition such that the intensity of the polarization P increases along the same direction as a direction of the polarization P may have the same effect as doped to the p-type.

Instead, when a composition of Al gradually decreases along an upper direction in InGaN that is c-axis oriented to Ga-face, that is, when the composition of Al gradually increases along a lower direction, the same effect as described above may be obtained. The direction of the overall polarization P in InGaN that is c-axis oriented to Ga-face is a lower direction. Because the composition of Al gradually increases along the lower direction, the intensities of the piezoelectric polarization and the overall polarization P increase downward. Thus, in case of InGaN that is c-axis oriented to Ga-face, when the composition of Al gradually decreases along the upper direction, the composition of Al may have the same effect as doped to the p-type.

Using this phenomenon, substantially the same effect as doped in p-type may be obtained without doping the channel region 103 at a high concentration. In addition, because the channel region 103 is undoped to the p-type at a high concentration, a high charge carrier rate may be realized. For example, the channel region 103 of the FET 100 shown in FIG. 1 may have a composition that gradually varies along a vertical direction such that the intensity of polarization in the channel region 103 gradually varies.

To this end, the drain region 101, which also acts as a growth substrate, grows in a c-axis orientation. Then, the drift region 102, the channel region 103, and the source region 104, which sequentially grow on the drain region 101, also have the c-axis orientation. A structure including the drain region 101 and the drift region 102 may be V-face in which a Group V element is located on the upper side along the c-axis direction and a Group III element is located on the lower side, or III-face in which the Group III element is located on the upper side, and the Group V element is located on the lower side. When the structure including the drain region 101 and the drift region 102 is V-face (or N-face), the composition of the channel region 103 may gradually vary such that the intensity of polarization gradually increases along the upper direction. Meanwhile, when the structure including the drain region 101 and the drift region 102 is III-face (or Ga-face), the composition of the channel region 103 may gradually vary such that the intensity of polarization gradually increases along the lower direction.

Figure 5:
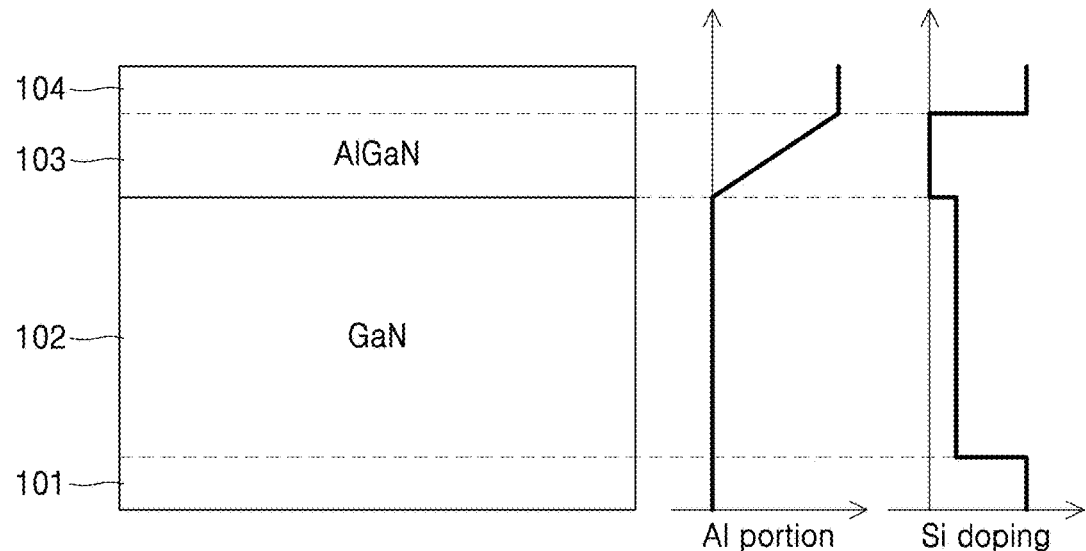
FIG. 5 illustrates an example of a change in composition and a change in doping concentration in the FET having the structure of FIG. 1.

FIG. 5 illustrates an example of a change in composition and a change in doping concentration in the FET 100 having a structure shown in FIG. 1. In the example of FIG. 5, a structure including the drain region 101 and the drift region 102 is c-axis oriented to N-face. Referring to FIG. 5, the drain region 101 and the drift region 102 may include GaN, and may include no Al or only a small amount of Al. The drain region 101 is doped to the n-type at a high concentration, and the drift region 102 is doped to the n-type at a low concentration. For example, a doping concentration of the drain region 101 is $10^{19}/cm^3$ or higher and a doping concentration of the drift region 102 is $10^{17}/cm^3$ or lower.

The channel region 103 may be undoped and may include $Al_xGa_{1-x}N$ (0<x 1). Alternatively the channel region 103 may include $B_yAl_xIn_zGa_{1-x-y-z}N$ (0≤x+y+z≤1). In the channel region 103, x, y, or x+y increases gradually along a vertical direction toward an upper portion. In other words, a composition of Al or B in the channel region 103 gradually increases toward an upper direction. Then, as shown in FIG. 3, a direction of polarization in the channel region 103 is an upper direction and an intensity of polarization gradually increases along an upper direction, and thus the channel region 103 may serve to provide holes.

A composition of Al in the channel region 103 may gradually increase by increasing a raw material of Al as the channel region 103 grows. The drain region 101, the drift region 102, the channel region 103, and the source region 104 may be formed by using, for example, a metal-organic chemical vapor deposition (MOCVD) process, a physical vapor deposition vapor deposition (PVD) process, an atomic layer deposition (ALD) process, or the like without limitation. In case of using the MOCVD process, trimethyl gallium (TMG) may be used as a raw material of Ga, trimethyl aluminum (TMA) may be used as a raw material of Al, ammonia ($NH_3$) may be used as a raw material of nitrogen, and $N_2$ gas and $H_3$ gas may be used as a carrier gas.

Accordingly, as the channel region 103 grows, the composition of Al may gradually increase along the upper direction by increasing an amount of TMA provided in a chamber.

The source region 104 may be doped to the n-type at a high concentration and may include $Al_aGa_{1-a}N$ (0<a≤1). Alternatively, the source region 104 may include $B_bAl_aIn_cGa_{1-a-b-c}N$ (0<a+b+c≤1). For example, a doping concentration of the source region 104 is $10^{19}/cm^3$ or higher. Further, a value of a (or a+b) may be equal to the maximum value of x (or x+y) in the channel region 103. In other words, a composition of the source region 104 may be the same as a composition of the uppermost surface of the channel region 103.

Figure 6A:
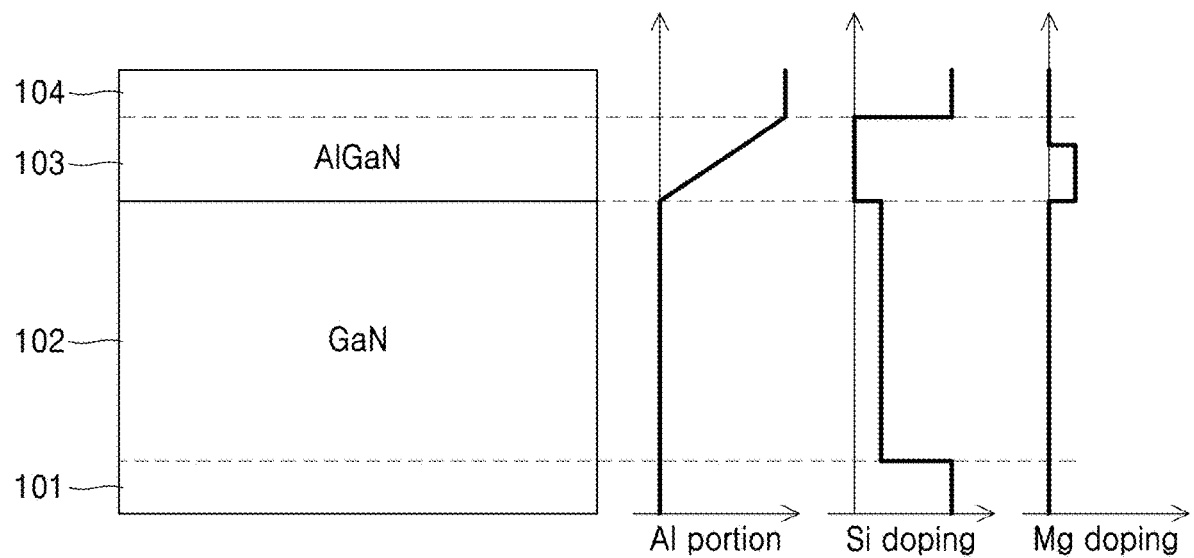
FIGS. 6A and 6B illustrate other examples of a change in composition and a change in doping concentration in the FET having the structure of FIG. 1.
Figure 6B:
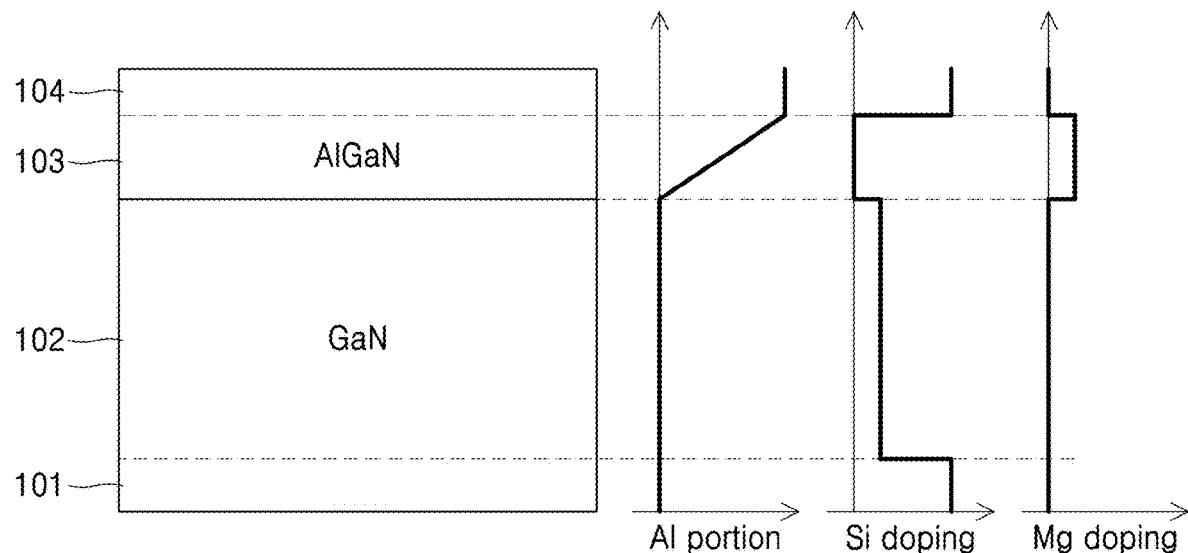

Although the channel region 103 is undoped at all in the example shown in FIG. 5, all or a part of the channel region 103 may be doped to the p-type at a low concentration in the vertical direction. For example, FIGS. 6A and 6B illustrate other examples of a change in composition and a change in doping concentration in the FET 100 having a structure shown in FIG. 1. In the example of FIGS. 6A and 6B, materials and compositions of the drain region 101, the drift region 102, the channel region 103, and the source region 104 are the same as those described in FIG. 5. Also, doping characteristics of the drain region 101, the drift region 102, and the source region 104 described in the example of FIG. 5 may be applied to the examples of FIGS. 6A and 6B as they are.

Referring to FIG. 6A, a part of the channel region 103 may be doped to the p-type in a vertical direction. For example, a part of the channel region 103 adjacent to the drift region 102 may be doped to the p-type. Instead, a part of the channel region 103 adjacent to the source region 104 may be doped to the p-type. Also, referring to FIG. 6B, the entire channel region 103 may be doped to the p-type in the vertical direction. As a dopant for doping the channel region 103, for example, magnesium (Mg) may be used. A doping concentration of the channel region 103 may be less than a doping concentration of the drain region 101 and a doping concentration of the source region 104. For example, the doping concentration of the channel region 103 is $10^{19}/cm^3$ or lower. Because the channel region 103 is doped at a low concentration, a drop in the mobility of the channel region 103 is not significant.

Figure 7:
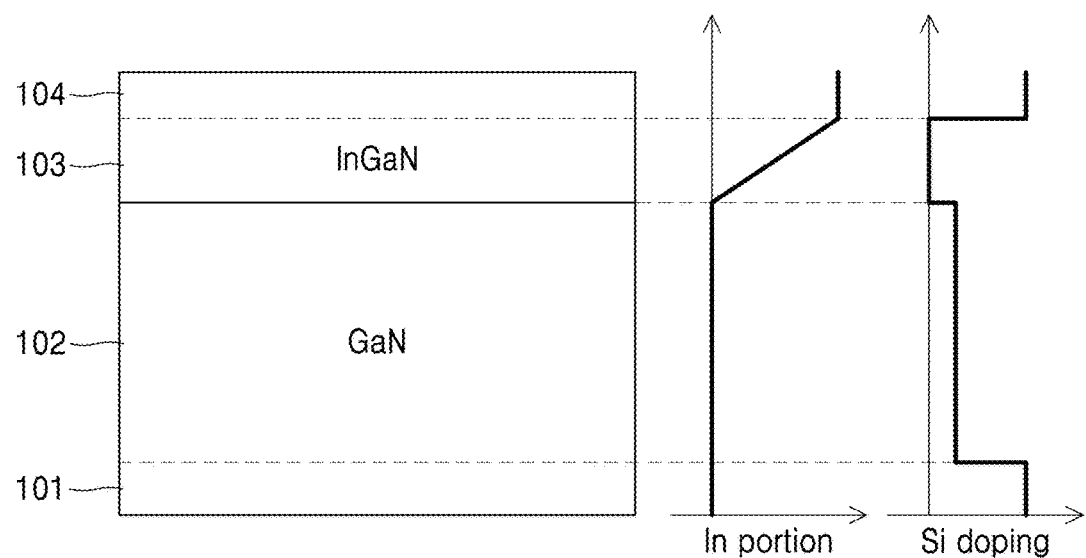
FIG. 7 illustrates another example of a change in composition and a change in doping concentration in the FET having the structure of FIG. 1.

Also, FIG. 7 illustrates another example of a change in composition and a change in doping concentration in the FET 100 having a structure shown in FIG. 1. In the example of FIG. 7, a structure including the drain region 101 and the drift region 102 is c-axis oriented in Ga-face. Referring to FIG. 7, the drain region 101 and the drift region 102 include GaN, and may include no In or only a small amount of In. The drain region 101 is doped to the n-type at a high concentration of $10^{19}/cm^3$ or higher, and the drift region 102 is doped to the n-type at a low concentration of $10^{17}/cm^3$ or lower.

The channel region 103 may be undoped or may be doped to the p-type at $10^{19}/cm^3$ or lower. In addition, the channel region 103 may include $In_xGa_{1-x}N$ (0≤x≤1) or $B_yAl_zIn_xGa_{1-x-y-z}N$ (0≤x+y+z≤1). In the channel region 103, x gradually increases toward an upper portion along a vertical direction. In other words, a composition of In in the channel region 103 gradually increases toward an upper direction. Then, as shown in FIG. 4, a direction of polarization in the channel region 103 is a lower direction, and an intensity of polarization gradually decreases along the upper direction, that is, the intensity of polarization gradually increases along the lower direction, and thus the channel region 103 may serve to provide holes.

A composition of In in the channel region 103 may gradually increase by increasing a raw material of In as the channel region 103 grows. For example, when the MOCVD process is used, trimethylgallium (TMG) may be used as a raw material of Ga, trimethyl indium (TMI) may be used as a raw material of In, ammonia ($NH_3$) may be used as a raw material of nitrogen, and $N_2$ gas and $H_3$ gas may be used as a carrier gas. Accordingly, as the channel region 103 grows, the composition of In may gradually increase along the upper direction by increasing an amount of TMI provided in a chamber.

The source region 104 may be doped to the n-type at a high concentration of $10^{19}/cm^3$ or higher and may include $In_aGa_{1-a}N$ (0<a≤1) or $B_bAl_cIn_aGa_{1-a-b-c}N$ (0<a+b+c≤1). A value of a may be equal to the maximum value of x in the channel region 103. In other words, a composition of the source region 104 may be the same as a composition of the uppermost surface of the channel region 103.

Figure 8:
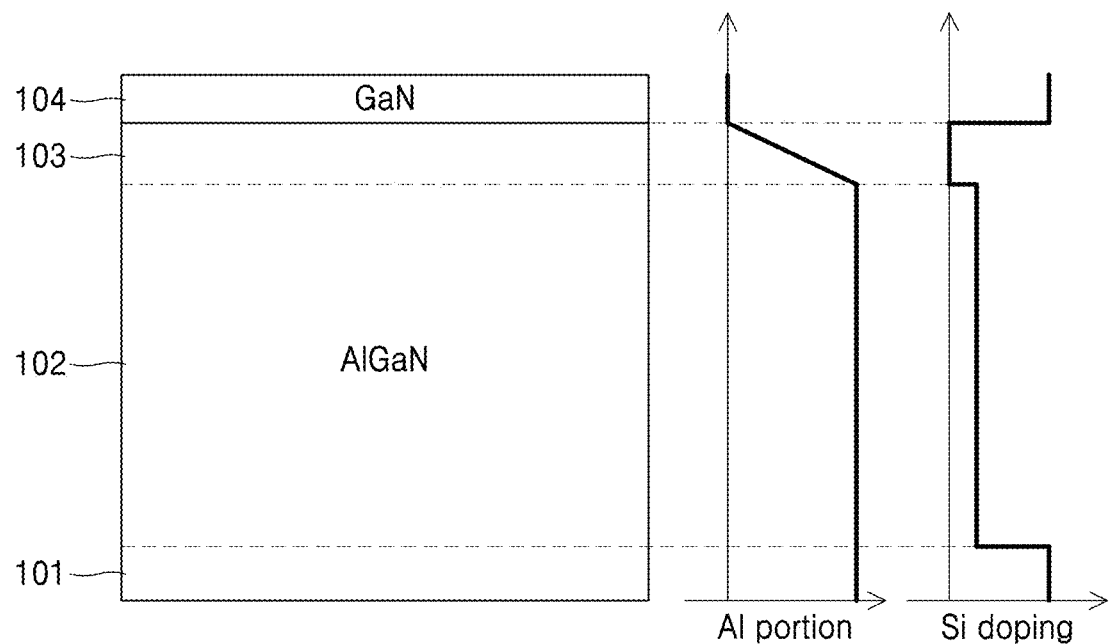
FIG. 8 illustrates another example of a change in composition and a change in doping concentration in the FET having the structure of FIG. 1.

FIG. 8 illustrates another example of a change in composition and a change in doping concentration in the FET 100 having a structure shown in FIG. 1. In the example of FIG. 8, a structure including the drain region 101 and the drift region 102 is c-axis oriented in Ga-face. Referring to FIG. 8, the drain region 101 and the drift region 102 include AlGaN. As described above, the drain region 101 is doped to the n-type at a high concentration, and the drift region 102 is doped to the n-type at a low concentration.

The channel region 103 may be undoped or may be doped to the p-type at $10^{19}/cm^3$ or lower. In addition, the channel region 103 may include $Al_xGa_{1-x}N$ (0≤x≤1) or $B_yAl_xIn_zGa_{1-x-y-z}N$ (0≤x+y+z≤1). In the channel region 103, x, y, or x+y gradually decreases toward an upper portion along a vertical direction. In other words, a composition of Al or B in the channel region 103 gradually decreases toward an upper direction. Then, as shown in FIG. 4, a direction of polarization in the channel region 103 is a lower direction, and an intensity of polarization gradually decreases along the upper direction, and thus the channel region 103 may serve to provide holes.

The source region 104 may be doped to the n-type at a high concentration and may include GaN. The source region 104 may include no Al or only a small amount of Al. For example, a composition of the source region 104 may be the same as a composition of the uppermost surface of the channel region 103.

Figure 9:
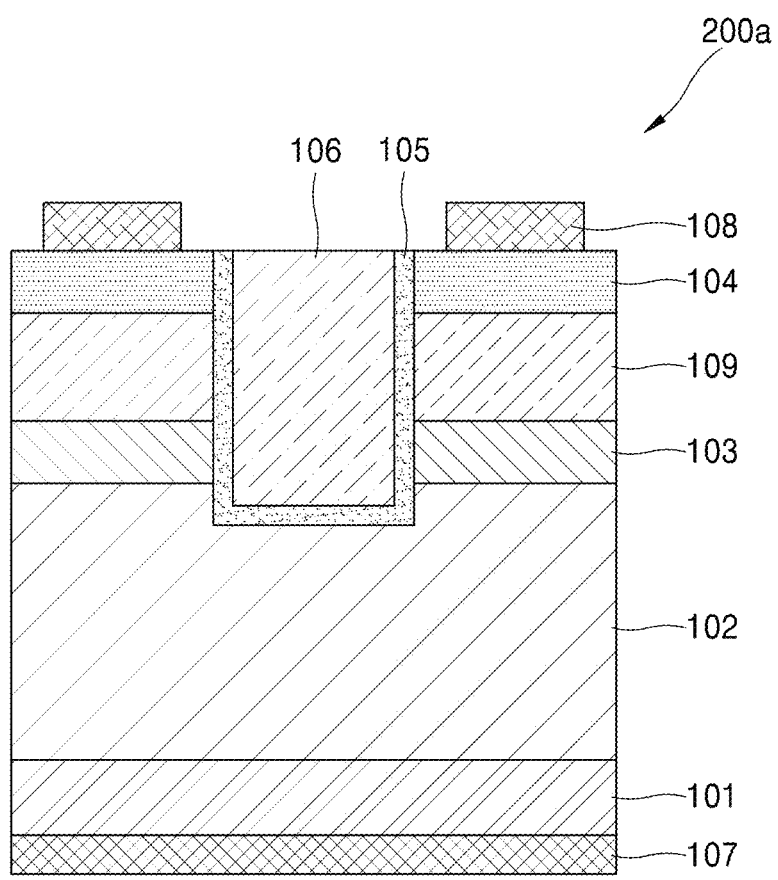
FIG. 9 is a cross-sectional view schematically showing a structure of a FET according to another embodiment.

FIG. 9 is a cross-sectional view schematically showing a structure of a FET 200a according to another embodiment. Referring to FIG. 9, the FET 200a according to another embodiment may include the drain region 101, the drift region 102 disposed on the drain region 101, the channel region 103 disposed on the drift region 102, an interface region 109 disposed on the channel region 103, the source region 104 disposed on the interface region 109, the gate 106 disposed to penetrate the source region 104, the interface region 109, and the channel region 103 in a vertical direction, the gate oxide 105 surrounding the gate 106, the drain electrode 107 disposed on a lower surface of the drain region 101, and a source electrode 108 disposed on the source region 104.

The FET 200a shown in FIG. 9 may further include the interface region 109 disposed between the channel region 103 and the source region 104, as compared to the FET 100 shown in FIG. 1. The remaining configuration of the FET 200a shown in FIG. 9 may be the same as that of the FET 100 shown in FIG. 1. The interface region 109 may serve to reduce a contact resistance of the source region 104 disposed thereon. The interface region 109 may be doped to the n-type at a medium concentration that is less than a doping concentration of the drain region 101 and greater than a doping concentration of the drift region 102. For example, a doping concentration of the interface region 109 may be greater than $10^{17}/cm^3$ and less than $10^{19}/cm^3$.

Figure 10:
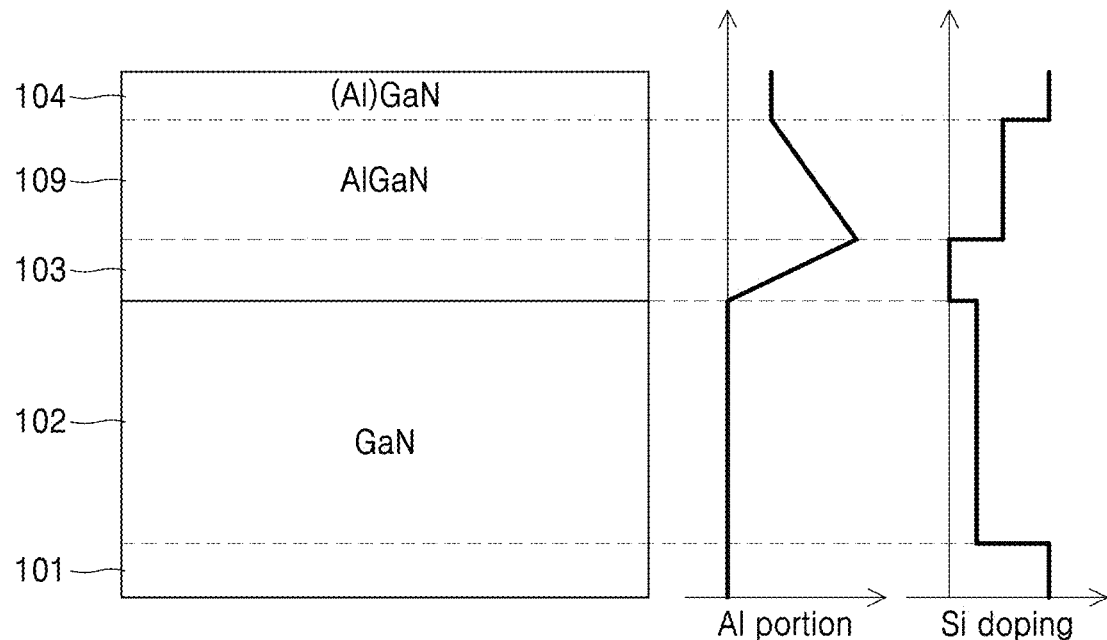
FIG. 10 illustrates another example of a change in composition and a change in doping concentration in the FET having the structure of FIG. 9.

FIG. 10 illustrates another example of a change in composition and a change in doping concentration in the FET 200a having a structure shown in FIG. 9. In the example of FIG. 10, a structure including the drain region 101 and the drift region 102 is c-axis oriented in N-face. Referring to FIG. 10, the drain region 101 and the drift region 102 may include GaN, and may include no Al or only a small amount of Al. The drain region 101 is doped to the n-type at a high concentration, and the drift region 102 is doped to the n-type at a low concentration.

The channel region 103 may be undoped or may be doped to the p-type at $10^{19}/cm^3$ or lower. In addition, the channel region 103 may include $Al_xGa_{1-x}N$ (0≤x≤1) or $B_yAl_xIn_zGa_{1-x-y-z}N$ (0≤x+y+z≤1). In the channel region 103, x, y, or x+y gradually increases toward an upper portion along a vertical direction. Therefore, a value of x (or x+y) at an interface with the drift region 102 is the minimum and a value of x (or x+y) at the uppermost surface of the channel region 103 is the maximum. For example, the minimum value of x (or x+y) may be 0 or slightly greater than 0. Then, a composition of Al or B in the channel region 103 gradually increases toward an upper direction. As a result, as shown in FIG. 3, a direction of polarization in the channel region 103 is an upper direction and an intensity of polarization gradually increases along the upper direction, and thus the channel region 103 may serve to provide holes.

The interface region 109 may be doped to the n-type at a medium concentration between $10^{17}/cm^3$ and $10^{19}/cm^3$ and may include $Al_xGa_{1-x}N$ (0≤x≤1) or $B_yAl_xIn_zGa_{1-x-y-z}N$ (0≤x+y+z≤1). In the interface region 109, x, y, or x+y gradually decreases toward an upper portion along a vertical direction. In other words, a composition of Al or B in the interface region 109 gradually decreases toward the upper direction. For example, a value of x (or x+y) at an interface with the channel region 103 is the maximum and a value of x (or x+y) at the uppermost surface of the interface region 109 is the minimum. The minimum value of x (or x+y) in the interface region 109 may be 0 or slightly greater than 0.

Then, in the interface region 109, a direction of polarization is an upper direction, and an intensity of polarization gradually decreases along the upper direction. Accordingly, positive (+) fixed charges are mainly distributed in an inner portion of the interface region 109, and negative (−) free charges are induced and thus space charges are neutralized. Therefore, the interface region 109 may have the same effect as doped to the n-type. The interface region 109 has the same effect as doped to the n-type due to a change in the intensity of polarization, and thus the interface region 109 may be doped at a concentration less than that of the drain region 101 or the source region 104.

The source region 104 may be doped to the n-type at a concentration of about $10^{19}/cm^3$ and may include $Al_aGa_{1-a}N$ (0≤a<1) or $B_bAl_aIn_cGa_{1-a-b-c}N$ (0≤a+b+c<1). The value of a may be equal to a value of x at the uppermost surface of the interface region 109. In other words, a composition of the source region 104 may be the same as a composition of the uppermost surface of the interface region 109. For example, the source region 104 may be GaN or AlGaN including a small amount of Al. Therefore, as compared with the example shown in FIG. 5, the source region 104 shown in FIG. 10 has a smaller content of Al than the source region 104 shown in FIG. 5. In general, AlGaN has a higher band gap than GaN, and thus has a high contact resistance. In addition, as the content of Al increases, the band gap and the contact resistance increase. In the example shown in FIG. 9, because the content of Al of the source region 104 may be minimized, the contact resistance may be reduced.

Figure 11:
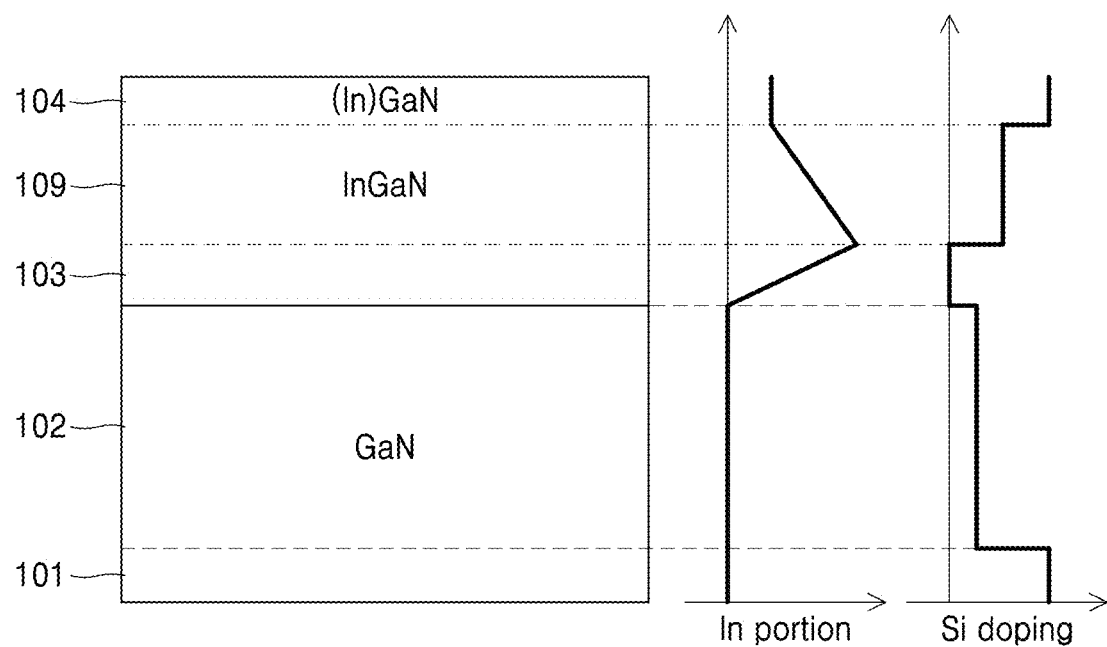
FIG. 11 illustrates another example of a change in composition and a change in doping concentration in the FET having the structure of FIG. 9.

FIG. 11 illustrates another example of a change in composition and a change in doping concentration in the FET 200a having a structure shown in FIG. 9. In the example of FIG. 11, a structure including the drain region 101 and the drift region 102 is c-axis oriented in Ga-face. Referring to FIG. 11, the drain region 101 and the drift region 102 may include GaN, and may include no In or only a small amount of In. The drain region 101 is doped to the n-type at a high concentration, and the drift region 102 is doped to the n-type at a low concentration.

The channel region 103 may be undoped or may be doped to the p-type at $10^{19}/cm^3$ or lower. In addition, the channel region 103 may include $In_xGa_{1-x}N$ (0≤x≤1) or $B_yAl_zIn_xGa_{1-x-y-z}N$ (0≤x+y+z≤1) In the channel region 103, x gradually increases toward an upper portion along a vertical direction. Then, as shown in FIG. 4, a direction of polarization in the channel region 103 is a lower direction and an intensity of polarization gradually increases along the lower direction, and thus the channel region 103 may serve to provide holes.

The interface region 109 may be doped to the n-type at a medium concentration between $10^{17}/cm^3$ and $10^{19}/cm^3$ and may include $In_xGa_{1-x}N$ (0≤x≤1) or $B_yAl_zIn_xGa_{1-x-y-z}N$ (0≤x+y+z≤1). In the interface region 109, x gradually decreases toward an upper portion along a vertical direction. In other words, a composition of In in the interface region 109 gradually decreases toward the upper direction. For example, a value of x at an interface with the channel region 103 is the maximum and a value of x at the uppermost surface of the interface region 109 is the minimum. The minimum value of x may be 0 or slightly greater than 0 in the interface region 109.

Then, a direction of polarization in the interface region 109 is a lower direction and an intensity of polarization gradually decreases along the lower direction. Accordingly, positive (+) fixed charges are mainly distributed in an inner portion of the interface region 109, and negative (−) free charges are induced and thus space charges are neutralized. Therefore, the interface region 109 may have the same effect as doped to the n-type.

The source region 104 may be doped to the n-type at a concentration of $10^{19}/cm^3$ or higher and may include $In_aGa_{1-a}N$ (0≤a<1) or $B_bAl_cIn_aGa_{1-a-b-c}N$ (0≤a+b+c<1). The value of a may be the same as a value of x at the uppermost surface of the interface region 109. In other words, a composition of the source region 104 may be the same as a composition of the uppermost surface of the interface region 109. For example, the source region 104 may be GaN or InGaN including a small amount of In.

Figure 12:
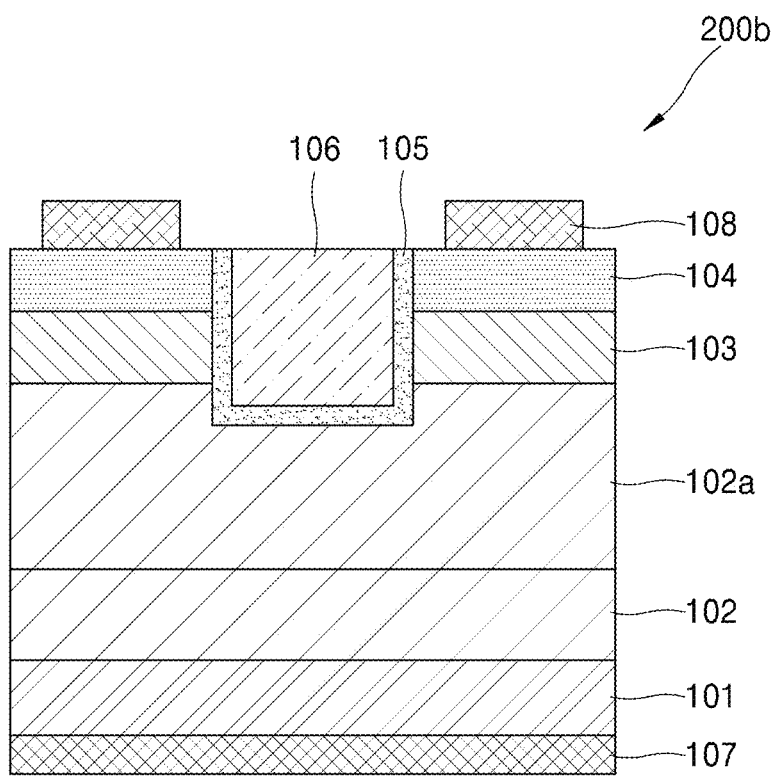
FIG. 12 is a cross-sectional view schematically showing a structure of a FET according to another embodiment.

FIG. 12 is a cross-sectional view schematically showing a structure of a FET 200b according to another embodiment. Referring to FIG. 12, the FET 200b according to another embodiment may include the drain region 101, the drift region 102 disposed on the drain region 101, an interface region 102a disposed on the drift region 102, the channel region 103 disposed on the interface region 102a, the source region 104 disposed on the channel region 103, the gate 106 disposed to penetrate the source region 104 and the channel region 103 in a vertical direction, the gate oxide 105 surrounding the gate 106, the drain electrode 107 disposed on a lower surface of the drain region 101, and the source electrode 108 disposed on the source region 104.

The FET 200b shown in FIG. 12 may further include the interface region 102a disposed between the drift region 102 and the channel region 103, as compared to the FET 100 shown in FIG. 1. A thickness of the drift region 102 shown in FIG. 1 may be approximately equal to a sum of a thickness of the drift region 102 and a thickness of the interface region 102a shown in FIG. 12. The remaining configuration of the FET 200b shown in FIG. 12 may be the same as that of the FET 100 shown in FIG. 1.

Figure 13:
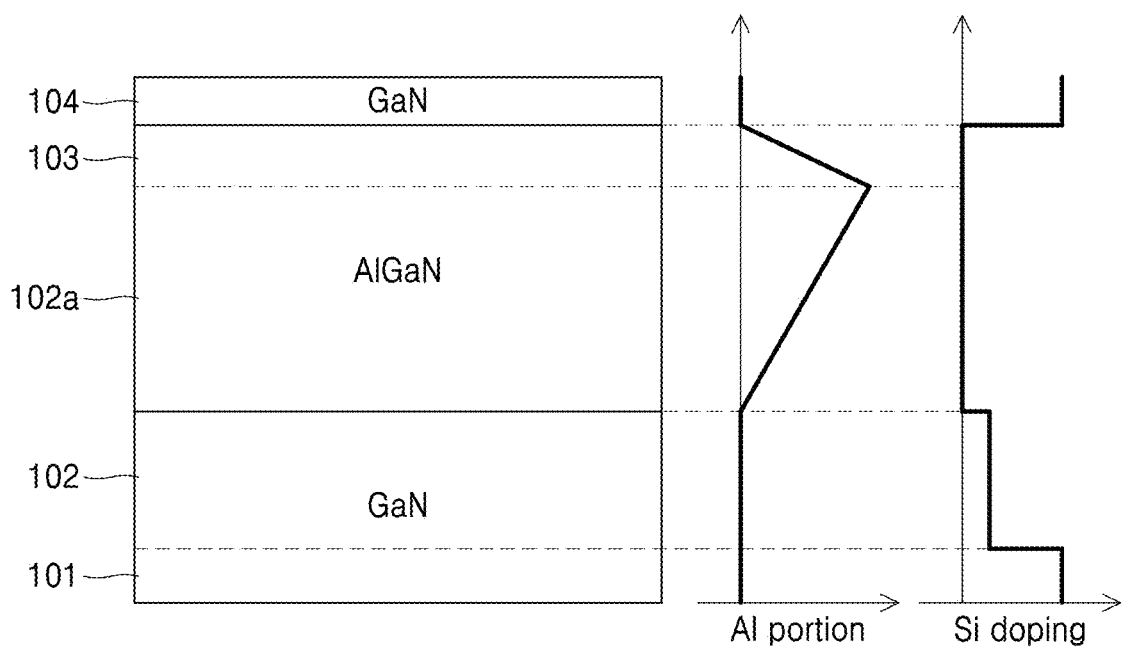
FIG. 13 illustrates an example of a change in composition and a change in doping concentration in the FET having the structure of FIG. 12.

FIG. 13 illustrates an example of a change in composition and a change in doping concentration in the FET 200b having a structure shown in FIG. 12. In the example of FIG. 13, a structure including the drain region 101 and the drift region 102 is c-axis oriented in Ga-face. Referring to FIG. 13, the drain region 101 and the drift region 102 may include GaN, and may include no Al or only a small amount of Al. Also, the drain region 101 is doped to the n-type at a high concentration, and the drift region 102 is doped to the n-type at a low concentration.

The interface region 102a may include $Al_xGa_{1-x}N$ (0≤x≤1) or $B_yAl_xIn_zGa_{1-x-y-z}N$ (0≤x+y+z≤1). In the interface region 102a, x, y, or x+y increases gradually along a vertical direction toward an upper portion. In other words, a composition of Al or B in the interface region 102a gradually increases toward the upper direction. Then, in the interface region 102a, a direction of polarization is a lower direction, and an intensity of polarization gradually increases along the upper direction. Accordingly, positive (+) fixed charges are mainly distributed in an inner portion of the interface region 102a, and negative (−) free charges are induced and thus space charges are neutralized. As a result, the interface region 102a need not be doped separately with an n-type dopant, such as silicon (Si), because the interface region 102a may have the same effect as doped to the n-type. The interface region 102a may serve to increase a breakdown voltage together with the drift region 102.

The channel region 103 may be undoped or may be doped to the p-type at $10^{19}/cm^3$ or lower. In addition, the channel region 103 may include $Al_xGa_{1-x}N$ (0≤x≤1) or $B_yAl_xIn_z Ga_{1-x-y-z}N$ (0≤x+y+z≤1). In the channel region 103, x, y, or x+y gradually decreases toward an upper portion along a vertical direction. In other words, a composition of Al or B in the channel region 103 gradually decreases toward an upper direction. For example, a value of x (or x+y) at the lowermost surface of the channel region 103 is the maximum and a value of x (or x+y) at the uppermost surface is the minimum. The value of x (or x+y) at the lowermost surface of the channel region 103 may be equal to the value of x (or x+y) at the uppermost surface of the interface region 102a. Also, the minimum value of x (or x+y) in the channel region 103 may be, for example, 0 or slightly greater than 0. Then, as shown in FIG. 4, a direction of polarization in the channel region 103 is a lower direction, and an intensity of polarization gradually decreases along the upper direction, and thus the channel region 103 may serve to provide holes.

Also, the source region 104 may be doped to the n-type at a high concentration and may include $Al_aGa_{1-a}N$ (0≤a<1) or $B_bAl_aIn_cGa_{1-a-b-c}N$ (0≤a+b+c<1). The value of a (or a+b) may be equal to a value of x (or x+y) at the uppermost surface of the channel region 103. For example, the source region 104 may be GaN or AlGaN including a small amount of Al.

Figure 14:
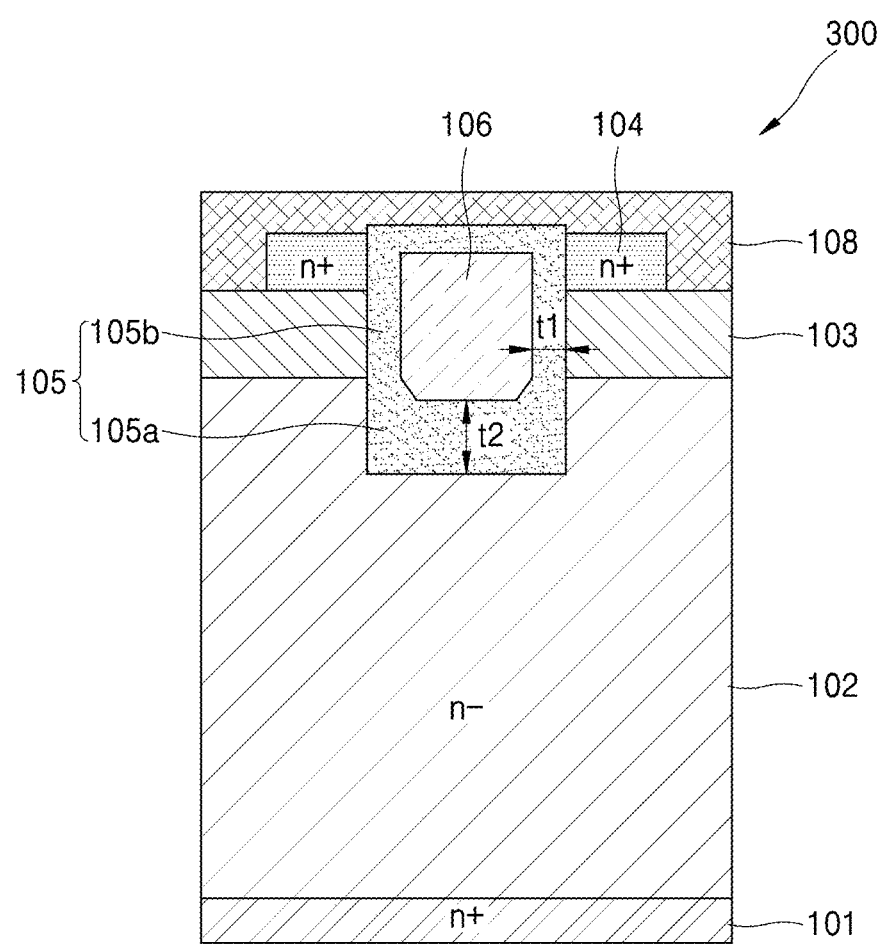
FIG. 14 is a cross-sectional view schematically showing a structure of a FET according to another embodiment.

FIG. 14 is a cross-sectional view schematically showing a structure of a FET 300 according to another embodiment. The FET 300 shown in FIG. 14 has a basically similar structure to the FET 100 shown in FIG. 1 and differs only partially. The gate oxide 105 of the FET 300 shown in FIG.

14 may be further disposed on an upper portion of the gate 106, as compared to the FET 100 shown in FIG. 1. The source region 104 is disposed on a part of an upper surface of the channel region 103 without covering the entire upper surface of the channel region 103. The source electrode 108 is disposed in contact with an upper surface of the source region 104, an upper surface of the channel region 103 that is not covered by the source region 104, and an upper surface of the gate oxide 105.

Meanwhile, the gate oxide 105 includes a first portion 105a disposed at a lower portion of the gate 106 and a second portion 105b disposed at both sides of the gate 106. In the FET 300 shown in FIG. 14, a thickness t2 in the vertical direction of the first portion 105a of the gate oxide 105 in a vertical direction is greater than a thickness t1 of the second portion 105b of the gate oxide 105 in a horizontal direction. Generally, when a voltage is applied between the source region 104 and the drain region 101, an electric field concentrates on a lower surface of the gate oxide 105 opposite to the drain region 101. According to the embodiment of FIG. 14, because the first portion 105a of the gate oxide 105 opposite to the drain region 101 has a great thickness, even if a high electric field is applied to the first portion 105a of the gate oxide 105, a possibility that the gate oxide 105 and the gate 106 are damaged may be reduced. Thus, a breakdown voltage of the FET 300 may increase.

Except for the differences described above, a configuration of the FET 300 shown in FIG. 14 may be the same as those of the FETs 100, 200b, and 200a described above. For example, a composition of a semiconductor material described with reference to FIGS. 5 to 13 may be applied to the FET 300 shown in FIG. 14 as it is.

Figure 15:
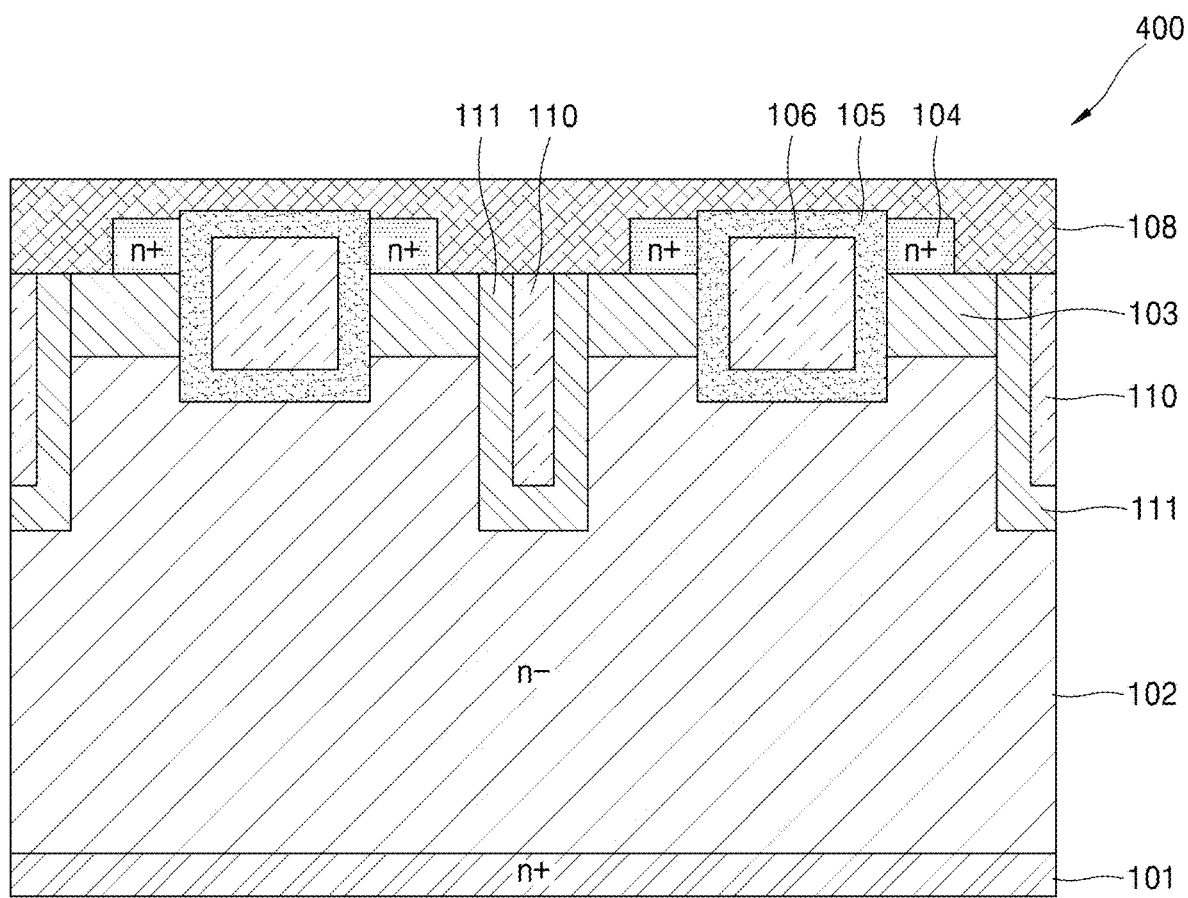
FIG. 15 is a cross-sectional view schematically showing a structure of a FET according to another embodiment.

FIG. 15 is a cross-sectional view schematically showing a structure of a FET 400 according to another embodiment. Although only one gate 106 is shown for convenience in FIGS. 1, 9, 12, and 14, a large number of gates 106 may be actually arranged along a horizontal direction. For example, referring to FIG. 15, the FET 400 includes a plurality of gates 106 arranged along the horizontal direction. Each gate 106 is surrounded by the gate oxide 105 and the channel region 103 and the source region 104 are disposed on both sides of the gate oxide 105.

The FET 400 may further include a metal plate 110 disposed between two adjacent gates 106 to penetrate the channel region 103 and the source region 104 in a vertical direction and an insulating layer 111 surrounding the metal plate 110. A vertical length of the metal plate 110 may be greater than a vertical length of the gate 106. Therefore, the shortest distance between a lower surface of the metal plate 110 and an upper surface of the drain region 101 is smaller than the shortest distance between a lower surface of the gate 106 and an upper surface of the drain region 101. In other words, the lower surface of the metal plate 110 is disposed closer to the drain region 101 than to the lower surface of the gate 106. The source electrode 108 may be disposed to contact an upper surface of the metal plate 110 and an upper surface of the insulating layer 111.

According to the embodiment shown in FIG. 15, a part of an electric field generated when a current flows between the source region 104 and the drain region 101 is induced to the metal plate 110. Therefore, the electric field distributes to the gate 106 and the metal plate 110, which may prevent a large electric field from concentrating on the gate 106. In this way, because an intensity of the electric field applied to the gate 106 may be reduced, a possibility that the gate oxide 105 and the gate 106 are damaged may be reduced. Thus, a breakdown voltage of the FET 400 may increase.

Except for the configurations relating to the metal plate 110 and the insulating layer 111 described above, a configuration of the FET 400 shown in FIG. 15 may be the same as those of the FETs 100, 200b, and 200a described above. For example, a composition of a semiconductor material described with reference to FIGS. 5 to 13 may be applied to the FET 400 shown in FIG. 15 as it is.

Figure 16:
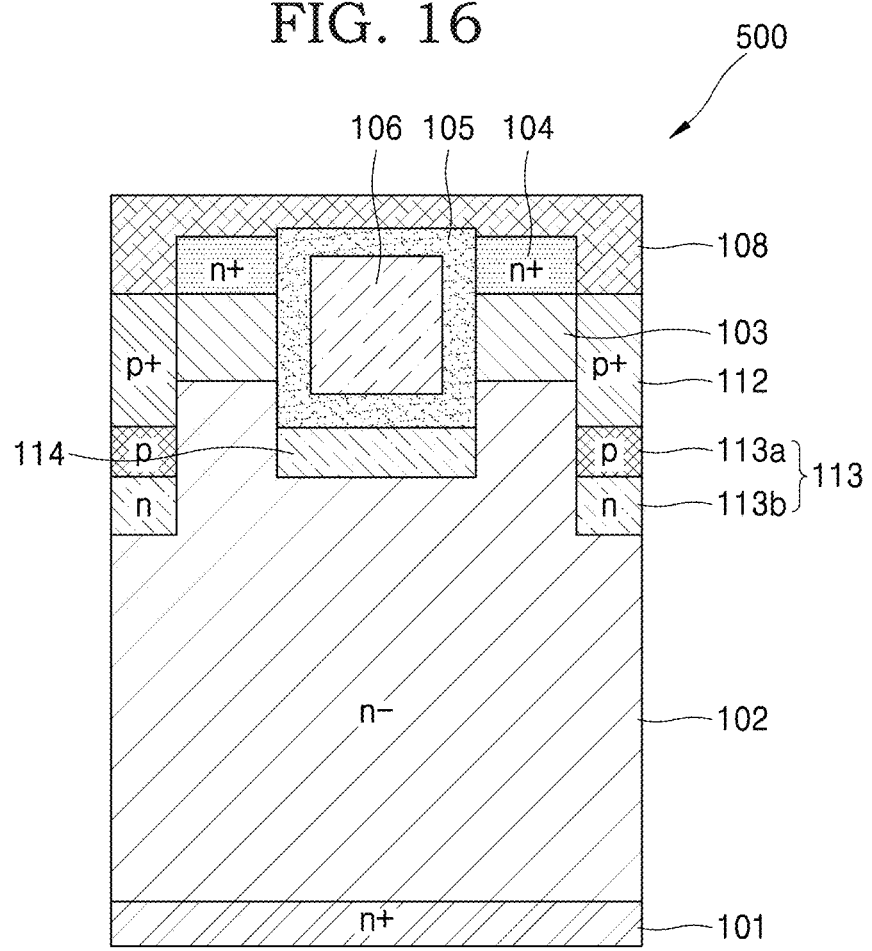
FIG. 16 is a cross-sectional view schematically showing a structure of a FET according to another embodiment.

FIG. 16 is a cross-sectional view schematically showing a structure of a FET 500 according to another embodiment. Although only one gate 106 is shown for convenience in FIG. 16, inventive concepts are not limited thereto. For example, like the FET 400 in FIG. 15, a large number of gates 106 may be actually arranged along a horizontal direction in the FET 500 shown in FIG. 16. Referring to FIG. 16, the FET 500 may include a well region 112 disposed between two adjacent gates 106 to penetrate the channel region 103 and the source region 104 in a vertical direction, a PN junction 113 disposed to extend in a lower portion of the well region 112 in a vertical direction, and a doping region 114 disposed in contact with a lower surface of the gate oxide 105. The source electrode 108 may be arranged to contact an upper surface of the well region 112.

The well region 112 may be doped to the p-type at a high concentration using magnesium (Mg) as a dopant. For example, a doping concentration of the well region 112 may be $10^{19}/cm^3$ or higher. A lower surface of the well region 112 may be located approximately on the same plane as a lower surface of the gate 106. Also, the doped region 114 may be doped to the p-type at a medium concentration. For example, a doping concentration of the doping region 114 is in the range of about $10^{17}/cm^3$ and $10^{19}/cm^3$. The well region 112 and the doping region 114 may disperse an electric field generated when a current flows between the source region 104 and the drain region 101 like the metal plate 110. Thus, it may prevent a large electric field from concentrating on the gate 106, thereby reducing a possibility that the gate oxide 105 and the gate 106 are damaged and increasing a breakdown voltage of the FET 500. In addition, the well region 112 and the doping region 114 may reduce an ON resistance between the source region 104 and the drain region 101.

The PN junction 113 may be disposed to extend below the well region 112 in a vertical direction. For example, the PN junction 113 may include a first doping layer 113a disposed directly below the well region 112 and a second doping layer 113b disposed below the first doping layer 113b. The first doping layer 113a may be doped in the p-type at a medium concentration and the second doping layer 113b may be doped in the n-type at a medium concentration. For example, doping concentrations of the first and second doped layers 113a and 113b are in the range of about $10^{17}/cm^3$ and $10^{19}/cm^3$. The first doping layer 113a may be located on the substantially same plane as the doping region 114. When a voltage greater than a breakdown voltage is applied to the FET 500, an avalanche current is generated, and the generated avalanche current may be induced toward the PN junction 113. Thus, the PN junction 113 may reduce a possibility of damage of the FET 500 due to the avalanche current.

Except for the configurations relating to the well region 112, the PN junction 113, and the doping region 114 described above, a configuration of the FET 500 shown in FIG. 16 may be the same as those of the FETs 100, 200b, and 200a described above. For example, a composition of a semiconductor material described with reference to FIGS. 5 to 13 may be applied to the FET 500 shown in FIG. 16 as it is.

Figure 17:
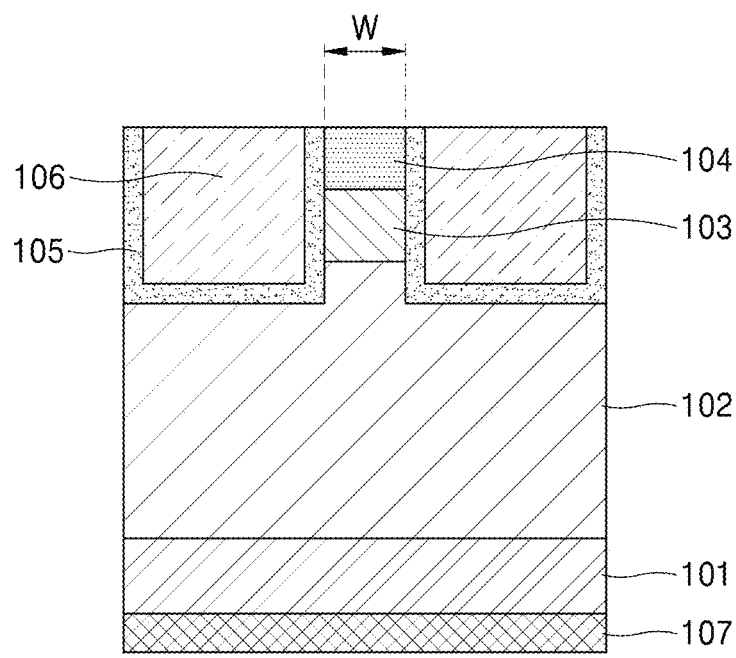
FIG. 17 is a cross-sectional view schematically showing a structure of a FET according to another embodiment.

Meanwhile, the FETs 100, 200a, 200b, 300, 400, and 500 described above may have a fin-FET shape with a narrow channel width. For example, FIG. 17 is a cross-sectional view schematically showing a structure of a FET according to another embodiment. Although the FET is shown centered on the channel region 103 and the source region 104 in FIG. 17, the FET shown in FIG. 17 may have the same configuration as the FET 100 of FIG. 1. Referring to FIG. 17, a width w of the channel region 103 and a width w of the source region 104 between two adjacent gates 106 may be, for example, 500 nm or less and greater than 0 nm.

Figure 18:
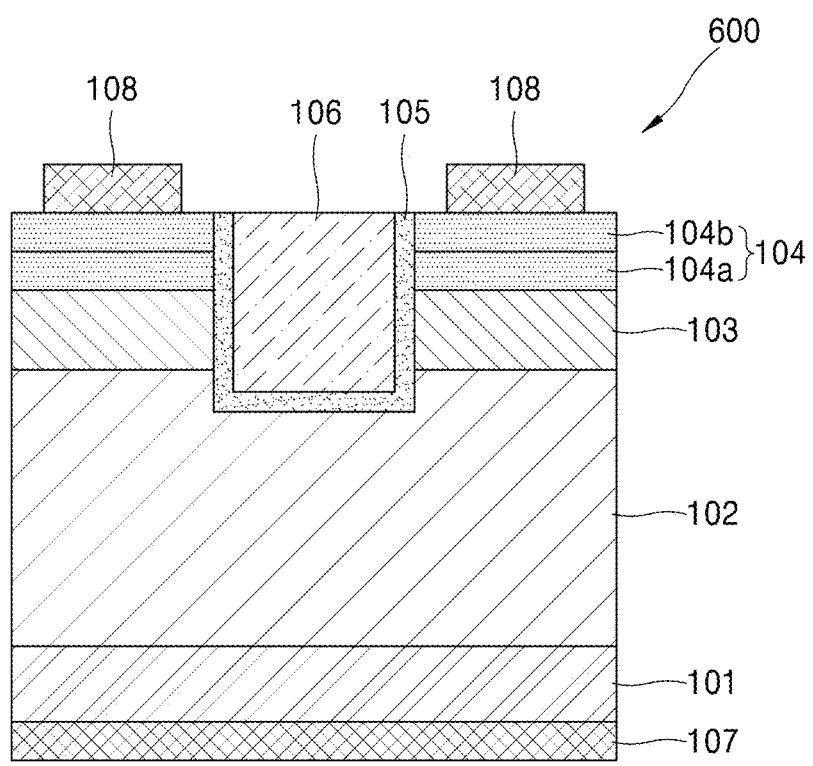
FIG. 18 is a cross-sectional view schematically showing a structure of a FET according to another embodiment.

Also, FIG. 18 is a cross-sectional view schematically showing a structure of a FET 600 according to another embodiment. Referring to FIG. 18, the source region 104 of the FET 600 may include a first compound semiconductor layer 104a disposed on the channel region 103 and a second compound semiconductor layer 104b disposed on the first compound semiconductor layer 104a. For example, the first and second compound semiconductor layers 104a and 104b may include various Group III-V compound semiconductor materials such as AlN, GaN, InN, AlInN, AlGaN, AlInGaN, InGaN, BAlGaN, BInGaN, BAlInGaN, etc.

The first compound semiconductor layer 104a and the second compound semiconductor layer 104b may have different compositions. Then, in the source region 104, a two-dimensional electron gas (2DEG) may be formed by a piezoelectric polarization due to an external strain caused by a lattice mismatch between the first compound semiconductor layer 104a and the second compound semiconductor layer 104b and a spontaneous polarization of the first compound semiconductor layer 104a and the second compound semiconductor layer 104b. For example, the 2DEG may be formed near an interface between the first compound semiconductor layer 104a and the second compound semiconductor layer 104b. The formed 2DEG may act as an electron supply source. Therefore, even if the source region 104 is undoped with a dopant such as silicon (Si), the source region 104 may have the same effect as doped to the n-type.

Except for the configurations relating to the first compound semiconductor layer 104a and the second compound semiconductor layer 104b described above, a configuration of the FET 600 shown in FIG. 18 may be the same as those of the FETs 100, 200b, and 200a described above. For example, a composition of a semiconductor material described with reference to FIGS. 5 to 13 may be applied to the FET 600 shown in FIG. 18 as it is.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A field effect transistor (FET) comprising:
   a drain region;
   a drift region on the drain region;
   a channel region on the drift region, the channel region being undoped or doped; and
   a source region on the channel region;
   wherein the channel region has a gradually varying composition in a direction from the drain region toward the source region such that an intensity of a polarization in the channel region gradually varies in the direction from the drain region toward the source region.

2. The FET of claim 1, wherein
   the channel region is undoped,
   at least one of the drain region, the drift region, the channel region, and the source region include a group III-V compound semiconductor as a semiconductor material,
   the group III-V compound semiconductor includes a group III element and a group V element,
   the group III element includes at least one of boron (B), aluminum (Al), gallium (Ga), or indium (In), and
   the group V element includes nitrogen (N).

3. The FET of claim 2, wherein
   the group III-V compound semiconductor is c-axis oriented such that the group V element is arranged on an upper side of the c-axis and the group III element is arranged on a lower side of the c-axis along a c-axis direction.

4. The FET of claim 3, wherein
   the drain region and the drift region include GaN,
   the channel region includes $Al_xGa_{1-x}N$ ($0 \leq x \leq 1$) or $B_yAl_xIn_zGa_{1-x-y-z}N$ ($0 \leq x+y+z \leq 1$), and
   x or y increases in the channel region in the direction from the drain region toward the source region.

5. The FET of claim 4, wherein
   the source region includes $Al_aGa_{1-a}N$ or $B_bAl_aIn_cGa_{1-a-b-c}N$ ($0 < a+b+c \leq 1$), and
   a is equal to a maximum value of x in the channel region.

6. The FET of claim 4, wherein
   the drain region and the source region are each doped at a first concentration, and
   the drift region is doped at a second concentration that is less than the first concentration.

7. The FET of claim 4, further comprising:
   an interface region between the channel region and the source region, wherein
   the interface region includes $Al_xGa_{1-x}N$ ($0 \leq x \leq 1$) or $B_yAl_xIn_zGa_{1-x-y-z}N$ ($0 \leq x+y+z \leq 1$), and
   x or y decreases in an upper direction in the interface region.

8. The FET of claim 7, wherein
   the source region includes $Al_aGa_{1-a}N$ or $B_bAl_aIn_cGa_{1-a-b-c}N$ ($0 \leq a+b+c < 1$), and
   a is greater than or equal to 0 and less than a maximum value of x in the channel region.

9. The FET of claim 7, wherein
   the drain region and the source region are each doped at a first concentration,
   the drift region is doped at a second concentration that is less than the first concentration, and
   the interface region is doped at a third concentration that is less than the first concentration and greater than the second concentration.

10. The FET of claim 2, wherein
    the group III-V compound semiconductor is c-axis oriented such that the group III element is arranged on an upper side of the c-axis, and the group V element is arranged on a lower side of the c-axis along a c-axis direction.

11. The FET of claim 10, wherein
    the drain region and the drift region include GaN,
    the channel region includes $In_xGa_{1-x}N$ ($0 \leq x \leq 1$) or $B_yAl_zIn_xGa_{1-x-y-z}N$ ($0 \leq x+y+z \leq 1$), and
    x increases in the direction from the drain region toward the source region.

12. The FET of claim 11, wherein
the source region includes $In_aGa_{1-a}N$ or $B_bAl_cIn_aGa_{1-a-b-c}N$ (0<a+b+c≤1), and a is equal to a maximum value of x in the channel region.
13. The FET of claim 11, wherein
the drain region and the source region each are doped at a first concentration, and
the drift region is doped at a second concentration that is less than the first concentration.
14. The FET of claim 11, further comprising:
an interface region between the channel region and the source region, wherein
the interface region includes $In_xGa_{1-x}N$ (0≤x≤1) or $B_yAl_zIn_xGa_{1-x-y-z}N$ (0≤x+y+z≤1), and
x decreases in an upper direction in the interface region.
15. The FET of claim 14, wherein
the source region includes $In_aGa_{1-a}N$ or $B_bAl_cIn_aGa_{1-a-b-c}N$ (0<a+b+c<1), and
a is less than a maximum value of x in the channel region.
16. The FET of claim 14, wherein
the drain region and the source region are each doped at a first concentration,
the drift region is doped at a second concentration that is less than the first concentration, and
the interface region is doped at a third concentration that is less than the first concentration and greater than the second concentration.
17. The FET of claim 10, wherein
the drain region, the drift region, and the source region include GaN,
the channel region includes $Al_xGa_{1-x}N$ (0≤x≤1) or $B_yAl_xIn_zGa_{1-x-y-z}N$ (0≤x+y+z≤1), and
x or y decreases in the channel region in the direction from the drain region toward the source region.
18. The FET of claim 17, wherein
the drain region and the source region are each doped at a first concentration, and
the drift region is doped at a second concentration that is less than the first concentration.
19. The FET of claim 17, further comprising:
an interface region between the drift region and the channel region, wherein
the interface region includes $Al_xGa_{1-x}N$ (0≤x≤1) or $B_yAl_xIn_zGa_{1-x-y-z}N$ (0≤x+y+z≤1), and
x or y in the interface region increases in an upper direction.
20. The FET of claim 19, wherein
the drain region and the source region are each doped at a first concentration, and
the drift region is doped at a second concentration that is less than the first concentration.
21. The FET of claim 10, wherein
the drain region and the drift region each include AlGaN,
the channel region includes $Al_xGa_{1-x}N$ (0≤x≤1) or $B_yAl_xIn_zGa_{1-x-y-z}N$ (0≤x+y+z≤1),
and x or y decreases in the channel region in the direction from the drain region toward the source region.
22. The FET of claim 21, wherein
the drain region and the source region are each doped at a first concentration, and
the drift region is doped at a second concentration that is less than the first concentration.
23. The FET of claim 1, wherein
the drain region, the drift region, and the source region are each doped with a first conductive type,
all or a part of the channel region in the direction from the drain region toward the source region is doped with a second conductive type that is electrically opposite to the first conductive type, and
a doping concentration of the channel region is less than a doping concentration of the drain region.
24. The FET of claim 23, wherein
a doping concentration of the channel region is $10^{19}/cm^3$ or lower.
25. The FET of claim 1, further comprising:
a gate penetrating the channel region and the source region in a vertical direction; and
a gate oxide surrounding the gate, wherein
the channel region is undoped.
26. The FET of claim 25, wherein
a lower portion of the gate is on a first portion of the gate oxide,
a second portion of the gate oxide extends along a side surface of the gate, and
a thickness of the first portion of the gate oxide in the vertical direction is greater than a width of the second portion of the gate oxide in a horizontal direction.
27. The FET of claim 25, further comprising:
a metal plate;
an insulating layer; and
a second gate, wherein
the gate is a first gate,
the first gate and the second gate are adjacent to each other,
the metal plate is between the first gate and the second gate,
the metal plate penetrates the channel region and the source region in the vertical direction, and
the insulating layer surrounds the metal plate.
28. The FET of claim 25, further comprising:
a doping region, wherein
the drain region, the drift region, and the source region are each doped with a first conductive type,
the doping region contacts a lower surface of the gate oxide, and
the doping region is doped with a second conductive type that is electrically opposite to the first conductive type.
29. The FET of claim 25, further comprising:
a well region; and
a second gate, wherein
the gate is a first gate, the drain region, the drift region, and the source region are each doped with a first conductive type,
the first gate and the second gate are adjacent to each other,
the well region is between the first gate and the second gate,
the well region penetrates the channel region and the source region in the vertical direction, and
the well region is doped with a second conductive type that is electrically opposite to the first conductive type.
30. The FET of claim 29, further comprising:
a PN junction extending in the vertical direction in a lower portion of the well region.
31. The FET of claim 25, further comprising:
a second gate, wherein
the gate is a first gate,
the first gate and the second gate are adjacent to each other, and
a width of the source region between the first gate and the second gate is about 500 nm or less.
32. The FET of claim 25, wherein
the drain region and the drift region are each doped with a first conductive type, and the source region includes an undoped first group III-V compound semiconductor layer and an undoped second group III-V compound semiconductor layer on the undoped first group III-V compound semiconductor layer, the undoped first group III-V compound semiconductor layer and the undoped second group III-V compound semiconductor layer have different compositions from each other.

33. The FET of claim 25, wherein
a first portion of the gate oxide extends between the gate and the drift region.

34. The FET of claim 33, wherein
a second portion of the gate oxide extends between the gate and the source region.

35. The FET of claim 34, wherein
the first portion of the gate oxide and the second portion of the gate oxide cross each other.

36. The FET of claim 1, wherein
the channel region is undoped,
the channel region includes a group III-V compound semiconductor as a semiconductor material,
the group III-V compound semiconductor includes a group III element and a group V element,
the group III element includes gallium (Ga) and at least one of boron (B), aluminum (Al), or indium (In),
the group V element includes nitrogen (N), and
a concentration of the at least one of boron (B), aluminum (Al), or indium (In) gradually varies in the direction from the drain region toward the source region in the channel region.

* * * * *